United States Patent
Chen

(10) Patent No.: US 9,734,908 B1
(45) Date of Patent: Aug. 15, 2017

(54) WRITING METHOD FOR RESISTIVE MEMORY CELL AND RESISTIVE MEMORY

(71) Applicant: Winbond Electronics Corp., Taichung (TW)

(72) Inventor: Frederick Chen, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/076,688

(22) Filed: Mar. 22, 2016

(51) Int. Cl.
*G11C 13/00* (2006.01)

(52) U.S. Cl.
CPC ...... *G11C 13/0097* (2013.01); *G11C 13/0069* (2013.01)

(58) Field of Classification Search
USPC .......................................................... 365/148
See application file for complete search history.

(56) References Cited

U.S. PATENT DOCUMENTS

| 6,363,013 | B1 | 3/2002 | Lu et al. | |
| 2014/0036573 | A1* | 2/2014 | Ishihara | G11C 13/0021 365/148 |
| 2014/0071734 | A1* | 3/2014 | Sugimae | G11C 13/0002 365/148 |

FOREIGN PATENT DOCUMENTS

WO  2014025434  2/2014

OTHER PUBLICATIONS

Frederick Chen, et al., "Writing Method for Resistive Memory Cell and Resistive Memory," Unpublished U.S. Appl. No. 14/953,447, filed Nov. 30, 2015, The specification, claims, and the drawings of the unpublished pending U.S. application have been stored in the Image File Wrapper (IFW) system.
"Office Action of Taiwan Counterpart Application", issued on Mar. 14, 2017, p. 1-p. 9, in which the listed references were cited.

* cited by examiner

*Primary Examiner* — Hoai V Ho
*Assistant Examiner* — Minh Dinh
(74) *Attorney, Agent, or Firm* — Jianq Chyun IP Office

(57) ABSTRACT

A writing method for a resistive memory cell and a resistive memory using thereof are provided. In the writing method, a group of RESET signals is provided to the resistive memory cell, so as to execute a writing operation. A current of the resistive memory cell is detected to determine whether the writing operation of the resistive memory cell is completed. When the writing operation of the resistive memory cell is not completed, widths of filament paths in the resistive memory cell are determined to be narrowed or not. The voltage of word line of the resistive memory cell in the group of RESET signals is reduced when the widths of the filament paths in the resistive memory cell are narrowed.

15 Claims, 2 Drawing Sheets

US 9,734,908 B1

WRITING METHOD FOR RESISTIVE MEMORY CELL AND RESISTIVE MEMORY

BACKGROUND OF THE INVENTION

Field of the Invention

The invention relates to a resistive memory technology, and more particularly relates to a writing method for a resistive memory cell and a resistive memory using the writing method.

Description of Related Art

In the resistive random-access memory (RRAM) technology, the three operations: forming operation, set operation, and reset operation are three important steps to ensure the electrical property and the data retention of the resistive memory cell. When executing the set/reset operation, the input voltage needs being progressively increased many times to complete the operations. With respect to the RRAM device, completing the reset operation may increase the durability of the RRAM.

Generally, the resistive random-access memory may change a width of a filament path according to magnitude and polarity of an applied pulse voltage. For example, when a data logic 1 is written, the width of the filament path may be narrowed by applying RESET pulse so as to form a high resistance state. When a data logic 0 is written, the width of the filament path may be widened by applying SET pulse having a reversed polarity so as to forum a low resistance state. However, when the input voltage is continuously or inclinedly increased to execute the set operation or the reset operation of the resistive memory cell, the current which is originally corresponding to the high-current state of the resistive memory cell may be decreased or the current which is corresponding to the low-current state of the resistive memory cell is increased so as to cause errors in data stored in the resistive memory cell, this phenomenon is called complementary switching (CS) manifestation. In other words, when the set operation or the reset operation of the resistive memory cell is executed, if an excessive input voltage is provided, the resistive memory cell may become contrary to expectation.

On the other hand, after reset signal/set signal is inputted to the resistive memory cell several times, and if it is discovered that the resistive memory cell may be in between the high resistance state and the low resistance state continuously, this state of the resistive memory cell is called as a local high resistance state/local low resistance state. In order to change the state of the resistive memory cell to be different from the local high resistance state/local low resistance state, the input voltage of the resistive memory cell needs being further adjusted.

Therefore, when executing the operations of the resistive memory cell, how to prevent the input voltage in the process of progressively increasing from causing an excessive voltage to make the resistive memory cell generate the complementary switching manifestation and how to change the state of the resistive memory cell to be different from the local high resistance state/local low resistance state are important topics.

SUMMARY OF THE INVENTION

The invention provides a writing method of a resistive memory device which may change the state of a resistive memory cell to be different from a local high resistance state (reset operation)/local low resistance state (set operation).

The writing method for the resistive memory cell in the invention includes following steps. A group of RESET signals is provided to the resistive memory cell, so as to execute a writing operation. A current of the resistive memory cell is detected to determine whether the writing operation of the resistive memory cell is completed. When the writing operation of the resistive memory cell is not completed, widths of filament paths in the resistive memory cell are determined whether to be narrowed. When the widths of the filament paths in the resistive memory cell are narrowed, a voltage of a word line of the resistive memory cell in the group of RESET signals is reduced.

In one embodiment of the invention, the writing method further includes a step that the group of RESET signals are continuously provided to the resistive memory cell when the widths of the filament paths in the resistive memory cell are not narrowed.

In one embodiment of the invention, the step that the group of RESET signals are continuously provided to the resistive memory cell further includes: gradually reducing a voltage of a source line of the resistive memory cell in the group of RESET signals.

In one embodiment of the invention, the writing method further includes a step that the writing operation of the resistive memory cell is determined whether to be completed after the voltage of the word line of the resistive memory cell in the group of RESET signals is reduced.

In one embodiment of the invention, the step for determining whether the writing operation of the resistive memory cell is completed includes: detecting whether the current of the resistive memory cell is smaller than a first current threshold.

In one embodiment of the invention, the step for determining whether the widths of the filament paths in the resistive memory cell are narrowed includes: detecting whether the current of the resistive memory cell is greater than a second current threshold, wherein the second current threshold is greater than the first current threshold.

In one embodiment of the invention, the writing method is a data reset method of the resistive memory cell.

A resistive memory of the invention includes a resistive memory cell array and a control circuit. The resistive memory cell array includes at least a resistive memory cell. The control circuit is coupled to the resistive memory cell. The control circuit provides a group of RESET signals to the resistive memory cell so as to execute a writing operation, and a current of the resistive memory cell is detected to determine whether the writing operation of the resistive memory cell is completed. When the writing operation of the resistive memory cell is not completed, the control circuit determines whether widths of filament paths in the resistive memory cell are narrowed. When the widths of the filament paths in the resistive memory cell are narrowed, the control circuit reduces a voltage of a word line of the resistive memory cell in the group of RESET signals.

The writing method for the resistive memory cell in the invention includes following steps. A group of RESET signals is provided to the resistive memory cell, so as to execute a writing operation. A current of the resistive memory cell is detected to determine whether the current is smaller than a first current threshold. When the current is not smaller than the first current threshold, the current of the resistive memory cell is determined whether the current is greater than a second current threshold which is greater than the first current threshold. When the current of the resistive memory cell is greater than the second current threshold, a voltage of a word line of the resistive memory cell in the group of RESET signals is reduced.

Based on the above, in the embodiments of the invention, when the writing method (such as reset operation) of the resistive memory cell is executed, the current of the resistive memory cell is used to determine whether the writing operation of the resistive memory cell is completed, and it is determined whether the widths of the filament paths are still excessively wide or narrowed when the writing operation of the resistive memory cell is not completed. When the widths of the filament paths in the resistive memory cell are determined to be narrowed, the voltage of the word line of the resistive memory cell is gradually reduced and other reset voltages (such as the voltage of the source line and the voltage of the bit line) are maintained, so as to change the state of the resistive memory cell to be different from the local high resistance state (reset operation)/local low resistance state (set operation) and then to complete resetting data of the resistive memory cell. As a result, the writing method is based on gradually decreasing the voltage of the word line of the resistive memory cell to extend the voltage window of reset operation, so as to reduce the probability that the resistive memory cell generates the complementary switching manifestation due to excessive input voltage.

In order to make the aforementioned and other features and advantages of the invention more comprehensible, embodiments accompanying figures are described in detail belows.

DESCRIPTION OF THE EMBODIMENTS

Figure 1:
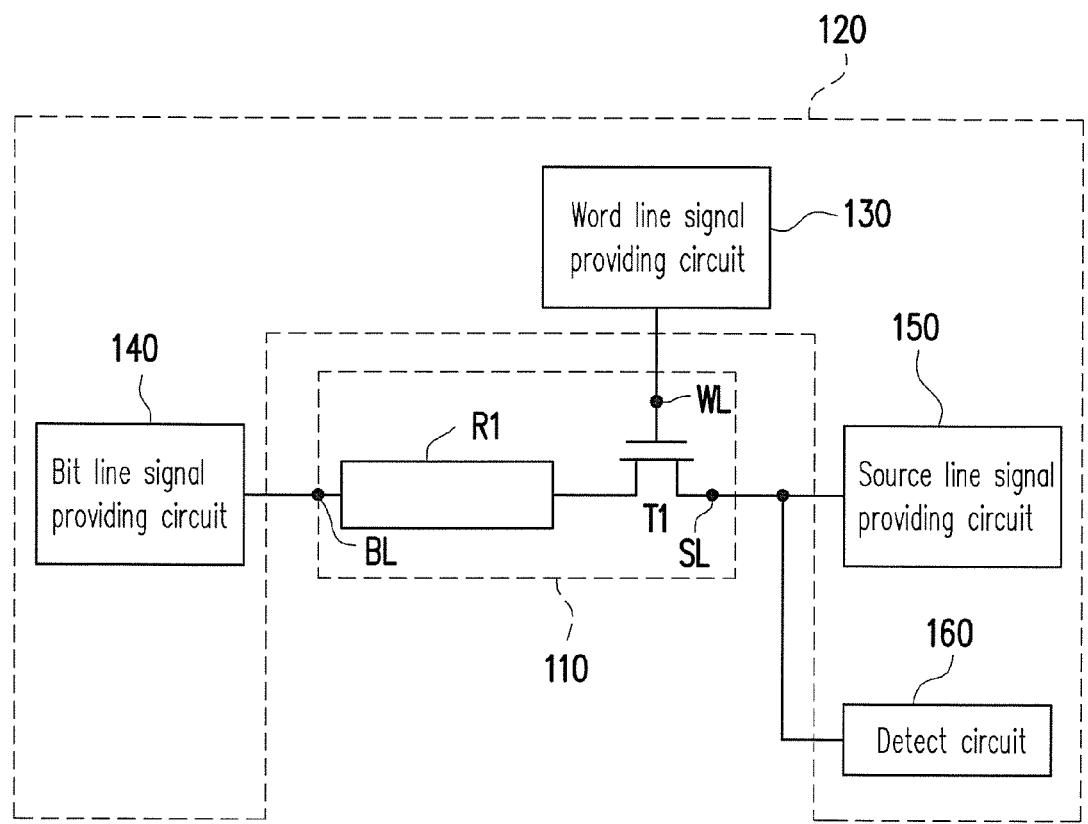
FIG. 1 is a block diagram depicting a resistive memory in one embodiment of the invention.

FIG. 1 is a block diagram depicting a resistive memory 100 in one embodiment of the invention. Referring to FIG. 1, the resistive memory 100 includes a resistive memory cell array and a control circuit 120. In order to simplify the description, one of the resistive memory cells 110 in the resistive memory cell array is depicted herein. The resistive memory cell array may include a plurality of resistive memory cells 110. In the embodiment, the resistive memory cell 110 includes a switching unit (such as a transistor T1) and a resistor R1. The resistor R1 may be actualized by a transition metal oxide layer, and will not limited thereto. The first terminal of the resistor R1 is a bit line BL, the second terminal of the resistor R1 is mutually coupled to the first terminal of the transistor T1. The second terminal of the transistor T1 is a source line SL.

The control circuit in the embodiments of the invention may be constituted by a plurality of circuit components. The control circuit 120 of the present embodiment may include the word line signal providing circuit 130, a bit line signal providing circuit 140, a source line signal providing circuit 150, and a detect circuit 160. The word line signal providing circuit 130 is coupled to the control terminal of the transistor T1 of the resistive memory cell 110, and the control terminal of the transistor T1 may be called as a word line WL of the resistive memory cell 110. The word line signal providing circuit 130 is configured to provide a voltage for the word line WL. The bit line signal providing circuit 140 is coupled to the bit line BL of the resistive memory cell 110 and configured to provide a voltage for the bit line BL. The source line signal providing circuit 150 is coupled to the source line SL of the resistive memory cell 110 and configured to provide a voltage for the source line SL. The detect circuit 160 detects the current of the resistive memory cell 110, so as to determine whether a writing operation (such as the forming operation, the set operation, or the reset operation) is completed according to the current of the resistive memory cell 110.

Figure 2:
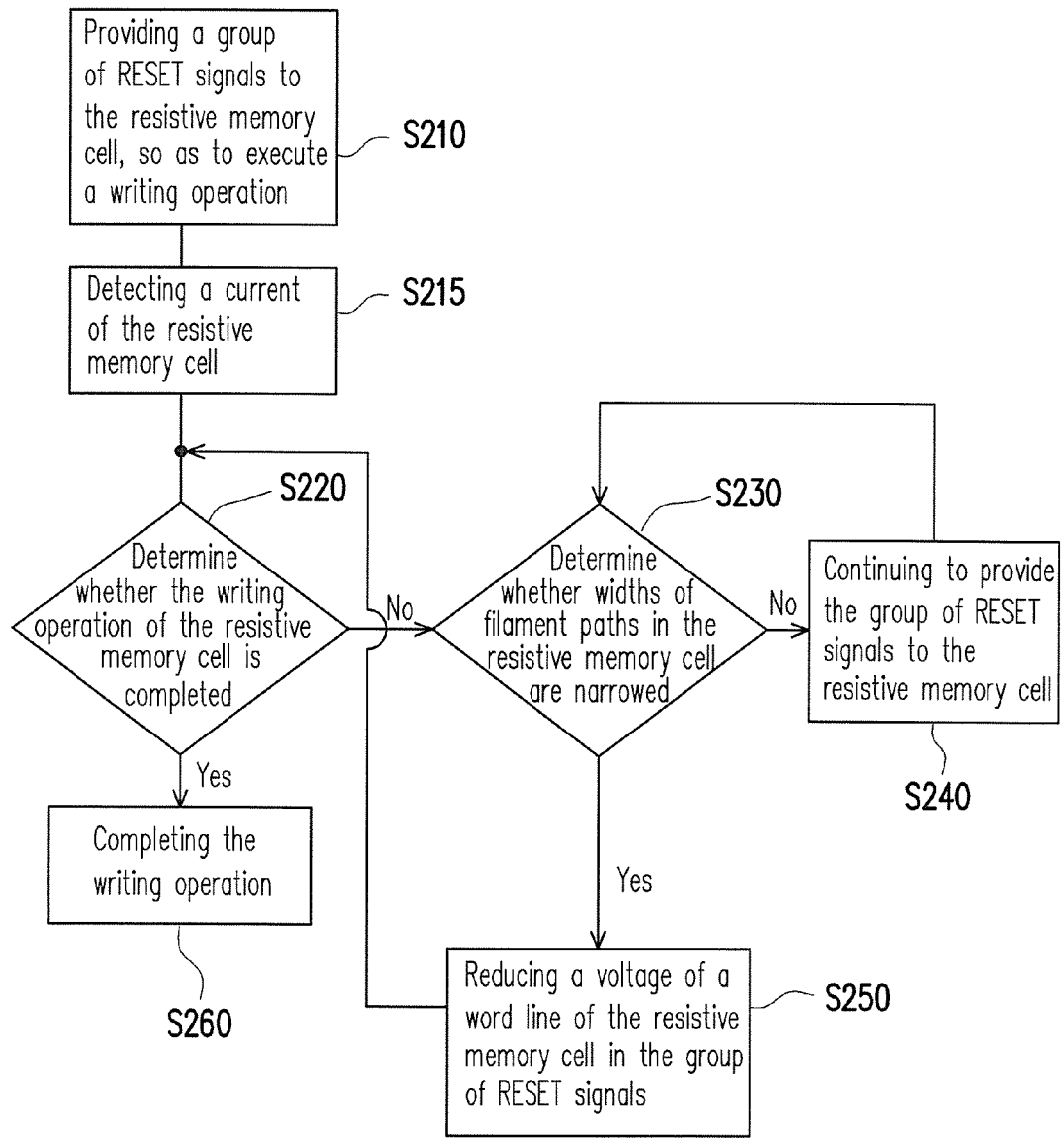
FIG. 2 is a flowchart of a writing method for a resistive memory cell depicted in one embodiment of the invention.

FIG. 2 is a flowchart of a writing method for the resistive memory cell 110 depicted in one embodiment of the invention. In the present embodiment of the invention, the writing method is a data reset method of the resistive memory cell as an example. In other embodiments, the writing method may also be a data set method. Referring to FIGS. 1 and 2 simultaneously, in step S210, the control circuit 120 provides a group of RESET signals to the word line WL, the bit line BL, and the source line SL in the resistive memory cell 110 so as to execute the writing operation. To be more specific, the word line signal providing circuit 130, the bit line signal providing circuit 140, and the source line signal providing circuit 150 in the control circuit 120 respectively provide voltage signals of the word line WL, the bit line BL, and the source line SL used for executing the writing operation to corresponding terminals of the resistive memory cell 110. In the present embodiment of the invention, the voltage signals of the word line WL, the bit line BL, and the source line SL used for executing the writing operation are called as a group of RESET signals.

In step S215, the control circuit 120 detects/monitors the current flowing through the resistive memory cell 110 via the detect circuit 160. It should be noted here, the control circuit 120 of the present embodiment may continue to provide the group of RESET signals to the resistive memory cell 110, and step S220 and step S230 are executed when the group of RESET signals are provided. In other words, the control circuit 120 in the present embodiment of the invention may provide each of the voltage signals in the group of RESET signals to the resistive memory cell 110 continuously, and dose not adopt a pulse voltage form to execute the writing method. In some embodiments, the pulse voltage form may be adopted to execute the writing method.

Returning to FIGS. 1 and 2, in step S220, the detect circuit 160 in the control circuit 120 determines whether the writing operation of the resistive memory cell 110 is completed. In the present embodiment, the detect circuit 160 bases on whether the current flowing through the resistive memory cell 110 is smaller than a preset first current threshold to determine whether the writing operation of the resistive memory cell 110 is completed. When the current of the resistive memory cell 110 is smaller than the preset first current threshold, the resistive memory cell 110 is in a high resistance state, and step S220 is followed by step S260 to represent that the writing method is completed.

In contrast, when the current of the resistive memory cell 110 is greater than the preset first current threshold, it represents that the resistive memory cell 110 is not in the high resistance state and the writing operation is not completed. Therefore, step S220 is followed by step S230, the control circuit 120 determines whether the widths of the filament paths in the resistive memory cell 110 are narrowed. In the present embodiment, the widths of the filament paths in the resistive memory cell 110 are determined whether to be narrowed based on whether the current of the resistive memory cell 110 is greater than a preset second current threshold (such as 100 μA). If the current of the resistive memory cell 110 is detected to be smaller than or equal to the preset second current threshold (such as 100 μA) (the decision in step S230 is yes), it represents that the widths of the filament paths in the resistive memory cell 110 are narrowed and the resistive memory cell 110 is in a local high resistance state. Thereby, step S230 is followed by step S250, the control circuit 120 reduces the voltage of the word line WL of the resistive memory cell 110 in the group of RESET signals. In step S250 of the present embodiment, the control circuit 120 may continue to maintain the other voltage signals (such as the voltage of the source line SL and the voltage of the bit line BL) except the voltage of the word line WL, and it is unnecessary to stop providing the voltage of the source line SL and the voltage of the bit line BL. By reducing the voltage of the word line WL, the state of the resistive memory cell is changed to be different from the local high resistance state (reset operation)/local low resistance state (set operation) to complete resetting data of the resistive memory cell 110, and to gradually reduce the current inputted in the resistive memory cell 110 by the control circuit 120 so as to prevent the complementary switching manifestation from generated.

After step S250 is completely executed, the control circuit 120 returns to step S220 to determine again whether the writing operation of the resistive memory cell 110 is completed. If step S250 is continuously and repeatedly executed, the control circuit 120 will gradually reduce the voltage of the word line WL in the group of RESET signals providing to the resistive memory cell 110, so as to gradually reduce the current inputted to the resistive memory cell 110 from the control circuit 120.

Returning to step S230 in FIG. 2, if the current of the resistive memory cell 110 is greater than the preset second current threshold (100 μA) (the decision in step S230 is no), it represents that the widths of the filament paths in the resistive memory cell 110 are not narrowed. Therefore, step S230 is followed by step S240, the control circuit 120 continues to provide the group of RESET signals to the resistive memory cell 110. In the present embodiment of the invention, when continuing to provide the group of RESET signals to the resistive memory cell 110, the control circuit 120 may also gradually reduce the voltage of the source line SL of the resistive memory cell 110 in the group of RESET signals so as to decrease the probability that the resistive memory cell 110 generates complementary switching manifestation. After step S240 is completely executed, step S230 is followed by step S240 to determine whether the widths of the filament paths in the resistive memory cell 110 are narrowed.

In summary, when the writing method (such as reset operation) of the resistive memory cell is executed, in the embodiments of the invention, the current of the resistive memory cell is used to determine whether the writing operation of the resistive memory cell is completed, and to determine whether the widths of the filament paths are still excessively wide or narrowed when the writing operation of the resistive memory cell is not completed. In addition, when the widths of the filament paths in the resistive memory cell are determined to be narrowed, the voltage of the word line of the resistive memory cell is gradually reduced and other reset voltages are maintained so as to complete resetting data of the resistive memory cell and to change the state of the resistive memory cell to be different from the local high resistance state (reset operation)/local low resistance state (set operation). As a result, the writing method is based on gradually decreasing the voltage of the word line of the resistive memory cell to extend the voltage window of reset operation, so as to reduce the probability that the resistive memory cell generates the complementary switching manifestation due to excessive input voltage.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A writing method for a resistive memory cell, comprising:
   providing a group of RESET signals to the resistive memory cell, so as to execute a writing operation;
   detecting a current of the resistive memory cell to determine whether the writing operation of the resistive memory cell is completed;
   determining whether widths of filament paths in the resistive memory cell are narrowed when the writing operation of the resistive memory cell is not completed; and
   reducing a voltage of a word line of the resistive memory cell in the group of RESET signals when the widths of the filament paths in the resistive memory cell are narrowed.

2. The writing method as recited in claim 1, further comprising:
   continuing to provide the group of RESET signals to the resistive memory cell when the widths of the filament paths in the resistive memory cell are not narrowed.

3. The writing method as recited in claim 2, the step for continuing to provide the group of RESET signals to the resistive memory cell comprises:
   gradually reducing a voltage of a source line of the resistive memory cell in the group of RESET signals.

4. The writing method as recited in claim 1, further comprising:
   determining whether the writing operation of the resistive memory cell is completed after the voltage of the word line of the resistive memory cell in the group of RESET signals is reduced.

5. The writing method as recited in claim 1, the step for determining whether the writing operation of the resistive memory cell is completed comprises:
   detecting whether the current of the resistive memory cell is smaller than a first current threshold.

6. The writing method as recited in claim 5, the step for determining whether the widths of the filament paths in the resistive memory cell are narrowed comprises:
   detecting whether the current of the resistive memory cell is greater than a second current threshold, wherein the second current threshold is greater than the first current threshold.

7. The writing method as recited in claim 1, wherein the writing method is a data reset method of the resistive memory cell.

8. A resistive memory, comprising:
   a resistive memory cell array, comprising at least a resistive memory cell; and
   a control circuit, coupled to the at least a resistive memory cell,
   wherein the control circuit provides a group of RESET signals to the at least a resistive memory cell so as to execute a writing operation, a current of the resistive memory cell is detected to determine whether the writing operation of the resistive memory cell is completed, when the writing operation of the resistive memory cell is not completed, the control circuit determines whether widths of filament paths in the at least a resistive memory cell are narrowed, and when the widths of the filament paths in the at least a resistive memory cell are narrowed, the control circuit reduces a voltage of a word line of the resistive memory cell in the group of RESET signals.

9. The resistive memory as recited in claim 8, wherein when determining that the widths of the filament paths in the at least a resistive memory cell are not narrowed, the control circuit continues to provide the group of RESET signals to the resistive memory cell.

10. The resistive memory as recited in claim 9, wherein when continuing to provide the group of RESET signals to the resistive memory cell, the control circuit gradually reduces a voltage of a source line of the resistive memory cell in the group of RESET signals.

11. The resistive memory as recited in claim 8, wherein after the voltage of the word line of the resistive memory cell in the group of RESET signals is reduced, the control circuit determines whether the writing operation of the at least a resistive memory cell is completed.

12. The resistive memory as recited in claim 8, wherein the control circuit detects whether the current of the at least a resistive memory cell is smaller than a first current threshold, so as to determine whether the writing operation of the at least a resistive memory cell is completed.

13. The resistive memory as recited in claim 12, wherein the control circuit detects whether the current of the at least a resistive memory cell is greater than a second current threshold, so as to determine whether the widths of the filament paths in the at least a resistive memory cell are narrowed, and wherein the second current threshold is greater than the first current threshold.

14. The resistive memory as recited in claim 8, wherein the writing operation is a data reset operation of the at least a resistive memory cell.

15. A writing method for a resistive memory cell, comprising:
   providing a group of RESET signals to the resistive memory cell, so as to execute a writing operation;
   detecting a current of the resistive memory cell to determine whether the current is smaller than a first current threshold;
   detecting whether the current of the resistive memory cell is greater than a second current threshold greater than the first current threshold when the current is not smaller than the first current threshold; and
   reducing a voltage of a word line of the resistive memory cell in the group of RESET signals when the current of the resistive memory cell is not greater than the second current threshold.

* * * * *